United States Patent
Todt et al.

(10) Patent No.: US 12,255,434 B2
(45) Date of Patent: Mar. 18, 2025

(54) LASER DEVICE WITH NON-ABSORBING MIRROR, AND METHOD

(71) Applicant: II-VI Delaware, Inc., Wilmington, DE (US)

(72) Inventors: René Todt, Kriens (CH); Markus Rosch, Basel (CH); Evgeny Zibik, Zurich (CH); Susanne Pawlik, Zurich (CH); Gustavo Villares, Zurich (CH)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 18/488,809

(22) Filed: Oct. 17, 2023

(65) Prior Publication Data

US 2024/0154382 A1   May 9, 2024

Related U.S. Application Data

(63) Continuation of application No. 17/249,916, filed on Mar. 18, 2021, now Pat. No. 11,824,322.

(60) Provisional application No. 63/200,122, filed on Feb. 16, 2021.

(51) Int. Cl.
  *H01S 5/02*   (2006.01)
(52) U.S. Cl.
  CPC ........ *H01S 5/0217* (2013.01); *H01S 2304/04* (2013.01)
(58) Field of Classification Search
  CPC ..... H01S 5/2086; H01S 5/0217; H01S 5/1039
  USPC .......................................................... 373/44.01
  See application file for complete search history.

(56) References Cited

U.S. PATENT DOCUMENTS

| | | | |
|---|---|---|---|
| 10,418,781 B1 | 9/2019 | Jakubowicz | |
| 10,515,332 B2 | 12/2019 | Bielefeldt et al. | |
| 2002/0015428 A1* | 2/2002 | Fukunaga | H01S 5/164 372/46.01 |
| 2002/0051477 A1* | 5/2002 | Fukunaga | H01S 5/2231 372/46.01 |
| 2003/0043873 A1* | 3/2003 | Fukunaga | H01S 5/164 372/45.01 |

\* cited by examiner

*Primary Examiner* — Tuan N Nguyen
(74) *Attorney, Agent, or Firm* — Blank Rome LLP

(57) ABSTRACT

A laser device with one or more active regions, such as quantum wells, gain/lighting media, or other devices, and one or more non-absorbing regions, may be formed by a first growth run (growing a first semiconductor layer), then performing selective, shallow-depth etching, and then a second growth run (growing a second semiconductor layer). The laser device may include a first portion, one or more active regions located on the first portion, and a second portion located on the active region(s). A third portion may be located on one or more ends of the first portion and on the second portion. The third portion may be formed during the second growth run, after the etching step. The non-absorbing region(s) may be formed by the third portion and the end(s) of the first portion. If desired, the non-absorbing region(s) may be produced without annealing or locally-induced quantum well intermixing.

14 Claims, 1 Drawing Sheet

LASER DEVICE WITH NON-ABSORBING MIRROR, AND METHOD

This application is a continuation of U.S. patent application Ser. No. 17/249,916, filed Mar. 18, 2021, which claims priority to U.S. Provisional Patent Application No. 63/200,122, filed Feb. 16, 2021, under 35 U.S.C. § 119(e). The aforementioned applications are hereby incorporated by reference in their entirety.

BACKGROUND

The present disclosure relates to laser devices, including, but not limited to, high-power semiconductor laser diodes, and methods of making laser devices. Some laser devices have facets and mirror surfaces which are susceptible to power degradation and catastrophic optical damage (COD). Methods of improving the facet/mirror surface stability of laser diodes are described in U.S. Pat. No. 10,418,781 (Jakubowicz) and U.S. Pat. No. 10,515,332 (Jakubowicz et al.).

SUMMARY

The present disclosure relates to a method of making a laser device, where the method includes performing first and second growth runs, and performing an etching step after the first growth run and before the second growth run.

According to one aspect of the present disclosure, the laser device includes first, second and third portions, and one or more active regions. The first and second portions and the active regions are formed during the first growth run, while the third portion is formed during the second growth run. According to this aspect of the present disclosure, the first portion includes semiconductor material, the one or more active regions are located on the first portion, the second portion is located on the one or more active regions, and include semiconductor material, and the third portion is located on one or more end portions of the first portion and on the second portion, and includes semiconductor material. The one or more active regions may be, for example, quantum wells, quantum dots, quantum dashes, quantum wires or double heterojunction. According to another aspect of the present disclosure, one or more non-absorbing regions are formed from the third portion.

The present disclosure also relates to a method of making an edge-emitting laser device, including: (1) performing a first growth run, including epitaxially growing first, second, and third preform layers on a substrate; (2) removing parts of the second and third preform layers by etching the second and third preform layers to form one or more etched regions, and thereby defining one or more ends of one or more active regions, such as quantum wells, and, if desired, leaving a layer of semiconductor material on the one or more active regions; and (3) performing a second growth run, including causing epitaxial growth in the etched region(s), to form one or more non-absorbing regions, and on the layer of semiconductor material. The step of leaving the layer of semiconductor material on the one or more active regions may be employed according to one aspect of the present disclosure, but is not necessarily required. According to one aspect of the present disclosure, the epitaxial growths in the etched region and on the layer of semiconductor material occur simultaneously.

According to another aspect of the present disclosure, a method of making an edge-emitting laser device may include three main steps, performed in sequence, as follows: growing a first semiconductor layer; selectively etching material grown during the growing of the first semiconductor layer; and growing a second semiconductor layer. As explained in more detail below, the first growing step may include depositing a layer of n-type semiconductor material on a substrate, subsequently depositing a preform layer on the n-type semiconductor material, and subsequently depositing a first layer of p-type semiconductor material on the preform layer. The etching may include removing ends of the first layer of p-type semiconductor material and ends of the preform layer, to thereby form etched regions, and to define the ends of one or more active regions, such as quantum wells, where the active regions are located between the etched regions. The second growing step may include depositing a second layer of p-type semiconductor material in the etched regions, on etched surfaces of the n-type semiconductor material, and on the first layer of p-type semiconductor material, to thereby form non-absorbing regions at opposite ends of the active region(s), and the second layer of p-type semiconductor material may be deposited simultaneously in the etched regions and on the first layer of p-type semiconductor material.

BRIEF DESCRIPTION OF THE DRAWINGS

Throughout the drawings, like elements are designated by like reference numerals and other characters. The drawings show non-limiting examples for purposes of illustration and explanation of the present disclosure, and are not drawn to scale.

DETAILED DESCRIPTION

Figure 1:
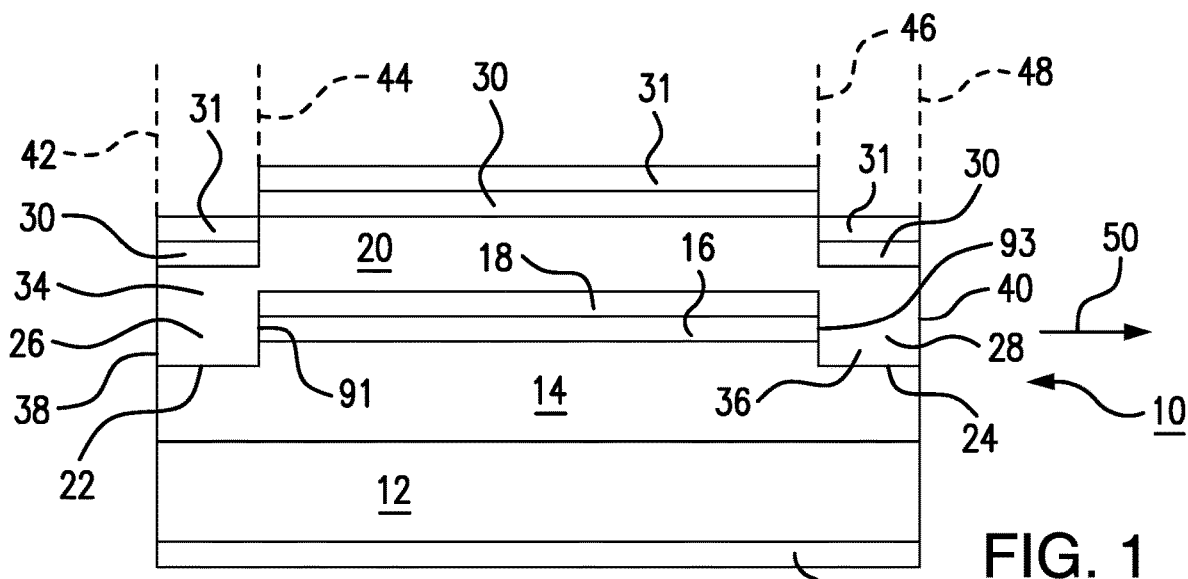
FIG. 1 is a side view of a laser device constructed in accordance with the present disclosure.

FIG. 1 shows an example of an InGaAs/AlGaAs-based quantum-well edge-emitting laser device 10 constructed in accordance with the present disclosure. The device 10, which may be in the form of a chip or bar, has a substrate 12, and an n-side portion 14 (an example of a first portion, and of a first-side portion) formed of n-type semiconductor material, and located on the substrate 12. The device 10 also has one or more quantum wells (examples of active regions in accordance with the present disclosure) 16 located on the n-side portion 14, and a first p-side portion 18 (an example of a second portion, and of a first second-side portion) formed of p-type semiconductor material, and located on the one or more quantum wells 16. A second p-side portion 20 (an example of a third portion, and of a second second-side portion) is formed of p-type semiconductor material, and is located on first and second etched surfaces 22, 24 of the n-side portion 14, and on the first p-side portion 18. First and second non-absorbing regions 26, 28 are located at first and second ends of the device 10, for forming mirrors at the first and second ends of the device 10. The laser device 10 also may have a waveguide ridge 30, and an ohmic contact 31 located on the waveguide ridge 30. The substrate 12 is located on a second ohmic contact 32. As illustrated in FIG. 1, most or all of the laser device 10 is operatively located between the two ohmic contacts 31, 32.

First and second end portions 34, 36 of the second p-side portion 20 are located within, and form parts of, the non-absorbing regions 26, 28. The second p-side portion 20 and the n-side portion 14 define facets 38, 40 at opposite ends of the non-absorbing regions 26, 28. The first and second regions 26, 28 are located between first and second planes 42, 44 and third and fourth planes 46, 48, respectively. The regions 26, 28 are not located between the second and third planes 44, 46. The facets 38, 40 may be co-planar with the first and fourth planes 42, 48. The one or more quantum wells 16, and the first p-side portion 18 are located entirely between the second and third planes 44, 46, and are not located between the first and second planes 42, 44, or between the third and fourth planes 46, 48. In the illustrated configuration, the waveguide ridge 30 and the first ohmic contact 31 extend from the first plane 42 to the fourth plane 48. However, if desired, the waveguide ridge 30 and the first ohmic contact 31 may be located entirely between the second and third planes 44, 46, and not between the first and second planes 42, 44, or between the third and fourth planes 46, 48. The first and fourth planes 42 48 are perpendicular to a direction of laser emission 50. The second and third planes 44 and 46 may be perpendicular to the direction of laser emission 50.

The n-side portion 14, the one or more quantum wells 16, and the first and second p-side portions 18, 20 have vertically built-up graded and/or layered structures (not shown in detail in the drawings) that may include layers of AlGaAs, GaAs, and other materials, including other semiconductor materials, some of which may be doped or undoped. The graded and/or layered structures are epitaxially deposited, during at least a step of growing a first semiconductor layer and a separate step of growing a second semiconductor layer (also referred to herein as two separate growth runs), on the substrate 12. The present disclosure is not limited, however, to the structure and composition of the illustrated device 10. Other material combinations may be employed in accordance with the present disclosure. In the illustrated configuration, the substrate 12 may include GaAs.

According to one aspect of the present disclosure, a method of manufacturing the laser device 10 has at least three steps, as follows: First, preform layers 70, 72, 74 (FIG. 2) for forming the n-side portion 14, the one or more quantum wells 16, and the first p-side portion 18 are epitaxially deposited on the substrate 12. The preform layers 70, 72, 74 are part of the preform illustrated in FIG. 2. The preform layers 70, 72, 74 are modified during subsequent steps of the manufacturing process to become elements 14, 16, 18 of the finished product 10. In particular, a lithography and etching process may be used to remove end portions 80, 82, 84, 86, 88, 90 of the preform layers 70, 72, 74, to thereby form etched regions at opposite ends of the device 10. Then, the second p-side portion 20 (FIG. 3) is epitaxially deposited on the n-side portion 14 and the first p-side portion 18. The end parts 92, 94 of the second p-side portion 20, which are located on the n-side portion 14, and the center part 96 of the second p-side portion 20, which is located on the first p-side portion 18, are epitaxially deposited simultaneously; that is, the three parts 92, 94, 96 are epitaxially deposited together at the same time. Then the first ohmic contact 31 is formed on the ridge 30.

Figure 2:
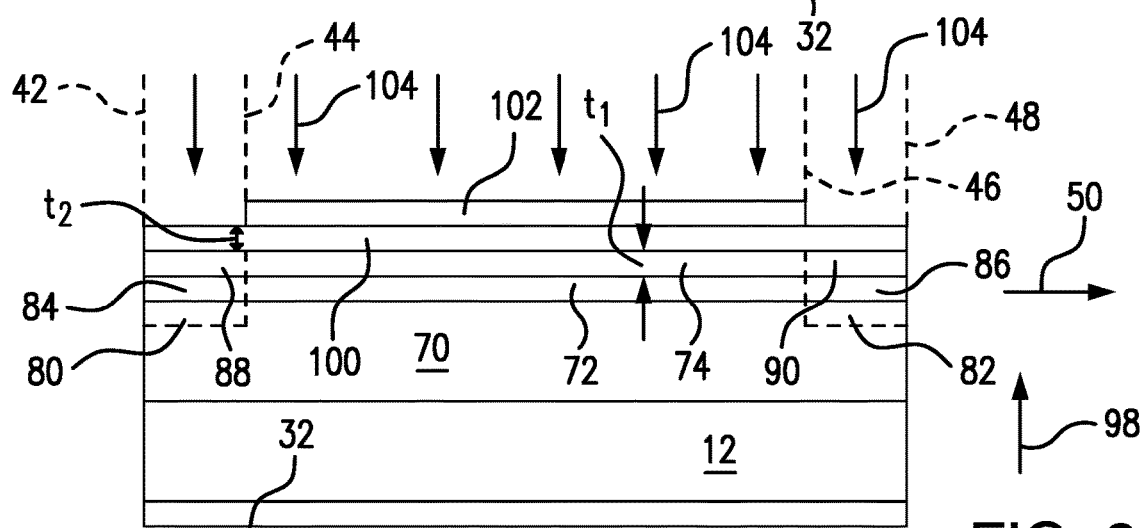
FIG. 2 is a side view of a preform for the laser device of FIG. 1, at a preliminary stage of a manufacturing process.

The device 10 may be formed by performing two growths, separated by a lithography and etching step. The result of the first growth run is illustrated in FIG. 2. During the first growth run, the n-side portion preform layer 70 is epitaxially grown on the substrate 12, and then the one or more quantum wells preform layer 72 is epitaxially grown on the n-side portion preform layer 70, and then the first p-side portion preform layer 74 is epitaxially grown on the one or more quantum wells preform layer 72. The three sequentially deposited preform layers 70, 72, 74, all of which may be deposited during the first growth run, extend continuously in the direction of laser emission 50 from the first plane 42 to the fourth plane 48. The vertical order and composition of the material layers (not illustrated) within the three preform layers 70, 72, 74 are the same as those within the n-side portion 14 (FIG. 1), the one or more quantum wells 16, and the first p-side portion 18, in the finished laser device 10, at least between the second and third planes 44, 46.

The thickness $t_1$ of the third preform layer 74, which is used to form the first A-side portion 18, measured in the growth direction 98, may be, for example, hundreds of nanometers, or not more than a few tens of nanometers, or not more than thirty nanometers. The present disclosure is not limited to the details of the configurations described herein. The illustrated configurations are non-limiting examples in accordance with the present disclosure. After a lithography and etching step (described below), the first p-side portion 18 has essentially the same thickness $t_1$ as that of the third preform layer 74. If desired, the third preform layer 74 may be capped by a thin layer 100 of GaAs, GaAsP, InGaP, or another suitable material to minimize oxidation of the surface of the first p-side portion 18 during subsequent processing. The thickness $t_2$ of the cap layer 100, in the growth direction 98, may be, for example, tens of nanometers, or ten nanometers, or a few nanometers. As noted above, the present disclosure is not limited to the details of the configurations described herein. The illustrated configurations are non-limiting examples in accordance with the present disclosure. The growth direction 98 is perpendicular to the direction of laser emission 50.

The lithography and etching process includes placing a suitable etchant barrier 102 (FIG. 2) over part of the cap layer 100, and using a suitable etchant 104 to physically etch away, and thereby remove, end portions of the cap layer 100, and the end portions 80, 82, 84, 86, 88, 90 of the three preform layers 70, 72, 74, including a small amount of the first preform layer 70 to define the upwardly facing etched surfaces 22, 24 of the n-side portion 14. The lithography and etching process ensures that no part of the one or more quantum wells 16 or the first p-side portion 18 is located between the first and second planes 42, 44 or between the third and fourth planes 46, 48, while permitting the one or more quantum wells 16 and the first p-side portion 18 to extend continuously from the second plane 44 to the third plane 46. The lithography and etching process causes the one or more quantum wells 16 to have etched ends 91, 93 at opposite ends of the device 10.

The etching depth target, where the etched surfaces 22, 24 are located, may be a few nanometers beneath the plane containing the lower surface of the one or more quantum wells 16, to ensure complete etching away of the end portions 84, 86 of the second preform layer 72. In order to avoid surface oxidation and contamination, the layer of the n-side portion 14 in which the etching is stopped should have low aluminum content. or be aluminum free The etching of the three preform layers 70, 72, 74 may be either wet etching or dry etching. After the etching is completed, the lithography barrier (mask) 102 may be stripped away (that is, removed).

Then the remaining part of the cap layer 100 may be removed under controlled atmosphere or vacuum, to avoid oxidation. The removal of the remaining part of the cap layer 100 may be performed by a baking procedure, or in-situ etching within a metalorganic vapor-phase epitaxy (MOVPE) process. Then the exposed surface of the first p-side portion 18 may be cleaned to reduce the level of surface contamination, and the cleaning step may be immediately followed by the second growth, which includes epitaxial growth of the second p-side portion 20. The cleaning step may include baking, etching, or a combination of baking and etching. A feature of the illustrated method is that the second growth is applied across the entire device 10—no selective growth is required, since the first growth is interrupted by the lithography and etching process.

According to a preferred aspect of the present disclosure, the lithography and etching process may be optimized to minimize any impact on the interfaces between non-etched and etched parts, which are coplanar with the second and third planes 44, 46. Too large of a step at the interfaces, in the growth direction 98, could result in a strong mode mismatch across the interfaces in the direction of laser emission 50, which could result in a corrugated vertical farfield laser pattern, and scattering of light into the substrate 12, increasing optical loss of the laser device. On the other hand, according to one example of the present disclosure, the growth interface from the first growth to the second growth should not be too close to the one or more quantum wells 16. According to another aspect of the present disclosure, providing the first p-side portion 18 with a thickness $t_1$, in the growth direction 98, in the range of from 30 nm to 200 nm should be sufficient to reduce the overlap of this interface with the optical mode to meet reliability targets in all or most telecommunication systems.

Thus, according to the present disclosure, the device 10 may be formed by epitaxial growth performed in two separate growth runs (that is, in a step of growing a first semiconductor layer and a separate step of growing a second semiconductor layer), instead of in a single growth run. In the illustrated embodiment, the epitaxial growth runs are separated from each other in time by at least the step of etching and removing the end portions 84, 86 of the second preform layer 72. The first growth step defines the bottom half of the laser structure, which includes n-waveguide material, an active region with single or multiple active regions, such as quantum wells, and a small part of the p-type waveguide. The latter layer may be formed to a thickness $t_1$ of 0 nm to 200 nm, or more preferably from 30 nm to 200 nm, above the last-grown quantum well. Moreover, to reduce risk of oxidation of material within the one or more quantum wells 16, which may include AlGaAs, the cap layer 100 may be formed of a suitable material such as GaAs, GaAsP, or InGaP.

Between the first and second growth runs (that is, between the step of growing the first semiconductor layer and the separate step of growing the second semiconductor layer), shallow etching of the three preform layers 70, 72, 74 is performed to remove portions 84, 86 of the one or more quantum wells preform layer 72, and the etch is extended to a desired depth $d_1$, for example a depth of from 0 nm to 50 nm, below the lowest surface of the one or more quantum wells 16 in the areas where the edge-emitting laser facets 38, 40 will be defined. The length $l_1$ of each such area, in the direction of light emission 50, may be in the range of from <1 μm to 100s μm. If desired, the lengths $l_1$ of the two areas may be different from each other. The present disclosure is not limited to the details of the configurations described herein. The illustrated configurations are non-limiting examples in accordance with the present disclosure.

If desired, a plurality of the devices 10 may be formed within a single wafer. The devices 10 may be separated from each other by cleaving or etching. The etched features may be arranged periodically on the wafer with a period equal to the laser cavity length in the direction of laser transmission 50, and equal to the laser pitch in a direction perpendicular to the direction of laser emission. However, if lasers with different pitch and cavity lengths are produced, the etching arrangement within the wafer may be quasi-periodical. During the etching step, alignment marks may be defined on the surface of the wafer to allow for consecutive laser fabrication processing. The wafer surface should be deoxidized/cleaned before performance of overgrowth steps.

The facet stability of a high-power edge-emitting diode laser may be a critical parameter for achieving high reliability. If the cleaved facets of the device are not protected, catastrophic failure at the front facet of the laser may occur even within the first few hours of operation. The present disclosure achieves the desired stabilization without necessarily requiring passivation of the facet surfaces. However, if desired, facet passivation may be used in combination with the approaches described above in order to avoid the formation of deep surface states/centers, which could still absorb light.

According to the present disclosure, the ends of the active region(s), such as quantum well(s), are removed close to the laser facets (that is, the one or more active regions do not extend the entire length of the device 10), and the removed material is replaced by non-absorbing higher-bandgap material to form the non-absorbing regions 26, 28. Thus, the present disclosure relates to a method of forming one or more non-absorbing regions without inducing quantum-well intermixing (QWI) close to a laser facet. It is advantageous to avoid high-temperature annealing, which could be used to achieve quantum-well intermixing, because such annealing may have an undesired effect on the quantum well(s). The undesired effect may be especially undesirable if it occurs between planes 44 and 46. In general, for regions that are not between planes 44 and 46, intermixing may be desirable.

According to a preferred aspect of the present disclosure, the device 10 may be manufactured without having to perform an etching step after the second p-side portion 20 is completely or even substantially formed. Therefore, according to the present disclosure, it is not necessary to complete, or even substantially complete, the epitaxial growth of a complete laser device, then etch away a portion of the device, and then perform a selective re-growth of widebandgap material. A process involving such deep etching (e.g., deeper than 1 μm) could be technologically difficult and expensive to perform, especially when the length $l_1$ of the etched region is relatively short. In the illustrated configuration, the total depth of the etched regions may be, for example, less than 250 nm.

Thus, the present disclosure avoids having to perform selective growth in a deep trench (e.g., deeper than 1 μm) and facilitates the formation of non-absorbing regions 26, 28 that are relatively short (that is, not long in the laser emission direction 50) so as to avoid losing gain material. The areas where the active regions, such as quantum wells, are removed form regions where light is not absorbed, thus inhibiting a root cause for catastrophic mirror damage. The lengths $l_1$ of the non-absorbing regions, in the direction of laser emission 50, may be the same, or the front and back regions may have different lengths, especially depending on optical power distribution within the optical cavity of the laser device.

Figure 3:
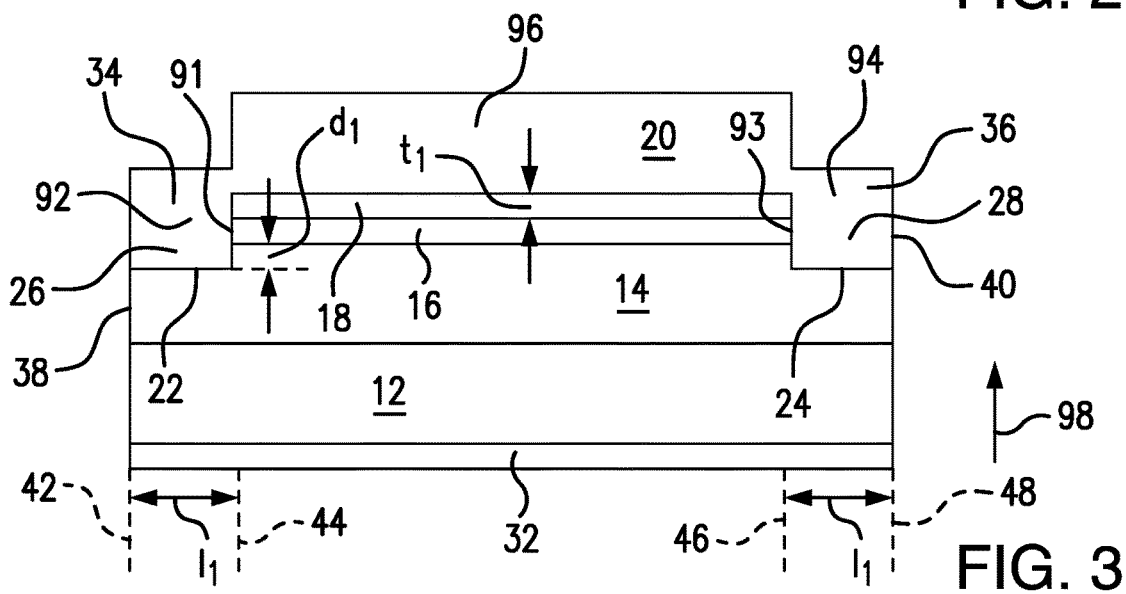
FIG. 3 is a side view of a second preform for the laser device of FIG. 1, at a subsequent stage of the manufacturing process.

The device 10 illustrated in FIG. 1 has two non-absorbing regions 26, 28 both of which are formed by the process illustrated in FIGS. 2 and 3. The present disclosure is not limited, however, to the illustrated configuration. The present disclosure also relates to a device which has (A) one region 28 at an outgoing end, which is formed by a first growth, followed by shallow etching, and then a second growth, and (B) some other suitable structure at the other end of the device.

There are also other advantages of the shallow-etching process compared to a deep-etching process, as follows: In order to avoid undesired back-reflections at the interface between the laser active region and a non-absorbing region, the effective index of the mode should be closely matched in the non-absorbing regions 26, 28. Such matching requires knowledge of the actual index of the lasing mode. Another, separate disadvantage associated with the deep-etching process that may be avoided according to the present disclosure is that, since the epitaxial growth in a deep trench could start on all surfaces, including side-walls, such deep growth could result in growth defects and/or dislocations.

According to an alternative embodiment of the present disclosure, a refractive index step may be established at the overgrowth interface in order to provide a broadband mirror with well-defined reflectivity to provide the desired feedback into the laser cavity.

A feature of the shallow-etching process described above is that the end parts 92, 94 of the second p-side portion 20 and the center part 96 of the second p-side portion 20 may be deposited simultaneously. As a result, the vertical layered structures of the end parts 92, 94 and the center part 96 closely correspond to each other, without any etching-induced break or discontinuity between the vertical layered structures. Structural differences between (A) a device like the device 10 and (B) a device formed with a deeper etch, where the non-absorbing regions are formed by selective deposition after most or all of the p-type vertical structure in the device is deposited, may be detected in various ways.

Among other techniques, a signature of a non-absorbing region formed according to a shallow-etch process may be observed by optical microscopy using a Nomarski prism to enhance height contrasts. Since the area close to the laser facet is relatively thin, a contrast may be observed in the microscope image. Differences may also be observed by using a cross-sectional tunneling electron microscope (TEM) image of the laser ridge 30 close to the laser facets 38, 40. A characteristic trace of the growth interface will be visible. This technique would also allow distinguishing the device 10 from one formed by a selective overgrowth process where one would see the material contrast between the non-absorbing region and the main part of the laser device. For broad-area lasers, secondary ion mass spectrometry (SIMS) measurements close to a facet and in the center of the laser device may reveal a characteristic difference in layer structure between (A) a device like the device 10 and (B) a device formed by a deep-etching step and subsequent selective epitaxial deposition.

The method described above is not limited to the described materials, and is not limited to just AlGaAs-based lasers. The method is also applicable to other epitaxial semiconductor lasers, including, but not limited to, AlGaN-based lasers, and especially for devices in which catastrophic facet damage could occur and facet stability should be preserved.

Further, if desired, a laser device may be constructed as described herein but by employing n-type semiconductor material instead of p-type semiconductor material while employing p-type semiconductor material instead of n-type semiconductor material.

The present disclosure is applicable to a variety of devices, including, but not limited to, narrow-stripe 980 nm pump lasers, broad-area single emitter lasers, bar products, and short-cavity narrow-stripe lasers, which may be used, for example, in connection with heat-assisted magnetic recording (HAMR) systems. The present disclosure may be applicable in a variety of systems, including, but not limited to, optical-pumping systems in telecommunications equipment, industrial high-power laser diode systems, automotive LIDAR systems, and heat and/or light-assisted magnetic recording systems for use in connection with hard disks.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements. The order in which steps are recited in the claims is not, by itself, limiting.

What is claimed as new and desired to be protected by Letters Patent of the United States is:

1. A laser device comprising:
    a first portion made of at least an n-type semiconductor material;
    at least one active region located on the first portion; and
    an other portion made of at least a p-type semiconductor material, wherein:
    the other portion is a single layer,
    the other portion comprises at least one non-absorbing region that covers at least one etched end of the at least one active region,
    the other portion comprises an inner side and an outer side that opposes the inner side downstream from the inner side in a growth direction that is perpendicular to a direction of laser emission of the laser device, and
    the outer side of the other portion comprises at least one first surface and a second surface offset downstream from the at least one first surface in the growth direction.

2. The laser device of claim 1, wherein:
    the laser device further comprises a second portion located on the at least one active region,
    the second portion is made of at least a p-type semiconductor material, and
    the other portion is a third portion.

3. The laser device of claim 2, wherein the laser device is an edge-emitting laser device.

4. The laser device of claim 2, wherein:
    the first portion and the third portion define at least one facet, and
    the at least one non-absorbing region is located between the at least one etched end and the at least one facet.

5. The laser device of claim 4, wherein:
    the laser device further comprises a substrate, and
    the first portion is located on the substrate.

6. The laser device of claim 5, wherein:
    the laser device further comprises a first ohmic contact and a second ohmic contact,
    the substrate is located on the second ohmic contact, and
    the first portion, the at least one active region, the second portion, and the third portion are located between the first ohmic contact and the second ohmic contact.

7. The laser device of claim 1, wherein the at least one non-absorbing region has a larger band-gap than the at least one active region such that light generated by the laser device is not absorbed by the at least one non-absorbing region.

8. The laser device of claim 7, wherein the non-absorbing region has a length in a direction of light emission, and wherein the length of the non-absorbing region is not greater than 500 µm.

9. The laser device of claim 8, wherein the at least one non-absorbing region comprises a first non-absorbing region at a first end of the laser device and a second non-absorbing region at a second end of the laser device.

10. The laser device of claim 9, wherein:
the at least one etched end comprises a first etched end and a second etched end,
the first non-absorbing region covers the first etched end, and
the second non-absorbing region covers the second etched end.

11. The laser device of claim 1, wherein:
the first portion comprises an inner side and an outer side that opposes the inner side downstream from the inner side in the growth direction, and
the outer side of the first portion comprises at least one first surface and a second surface offset downstream from the at least one first surface in the growth direction.

12. The laser device of claim 11, wherein:
the at least one active region is located on the second surface of the first portion, and
the at least one active region is not located on the at least one first surface of the first portion.

13. The laser device of claim 11, wherein the first portion is a single layer.

14. The laser device of claim 1, wherein at least one portion of the inner side of the other portion is upstream in the growth direction from the at least one active region.

* * * * *